United States Patent
Barbieri et al.

(10) Patent No.: US 9,288,573 B2
(45) Date of Patent: Mar. 15, 2016

(54) INTERFACE CIRCUIT FOR CONNECTING A MICROPHONE CIRCUIT TO A PREAMPLIFIER

(75) Inventors: Andrea Barbieri, Lodi (IT); Germano Nicollini, Piacenza (IT)

(73) Assignee: ST-ERICSSON SA, Plan-les-Ouates (CH)

( * ) Notice: Subject to any disclaimer, the term of this patent is extended or adjusted under 35 U.S.C. 154(b) by 244 days.

(21) Appl. No.: 13/885,657

(22) PCT Filed: Oct. 14, 2011

(86) PCT No.: PCT/EP2011/068029
§ 371 (c)(1),
(2), (4) Date: Jul. 23, 2013

(87) PCT Pub. No.: WO2012/065793
PCT Pub. Date: May 24, 2012

(65) Prior Publication Data
US 2013/0308795 A1    Nov. 21, 2013

Related U.S. Application Data

(60) Provisional application No. 61/429,930, filed on Jan. 5, 2011.

(30) Foreign Application Priority Data

Nov. 15, 2010    (EP) ..................... 10191206

(51) Int. Cl.
*H04R 3/00*    (2006.01)
*H03H 5/12*    (2006.01)
*H03H 11/46*   (2006.01)

(52) U.S. Cl.
CPC . *H04R 3/00* (2013.01); *H03H 5/12* (2013.01); *H03H 11/46* (2013.01)

(58) Field of Classification Search
CPC ............. H04R 3/00; H03H 5/12; H03H 11/46
USPC ........................................................ 381/120
See application file for complete search history.

(56) References Cited

U.S. PATENT DOCUMENTS 5,124,586 A      6/1992  Carobolante
5,568,561 A *   10/1996  Whitlock ...................... 381/120
(Continued)

OTHER PUBLICATIONS

Lamothe, Andre, The Black Art of Video Game Console Design, Dec. 12, 2005, Sams, chapter 3, sections 3.2-33.2.5.*
Bill Whitlock, Jensen Transformers Inc.: "A New Balanced Audio Input Circuit for Maximum Common Mode Rejection IN real.World Environments," Nov. 8, 1996, 5 pages.
Low-Noise, Low-Distortion Instrumentation Amplifier, Replacement for SSM2017, Texas Instruments Data Sheet, Feb. 1, 2005, 15 pages.

(Continued)

*Primary Examiner* — Sonia Gay
(74) *Attorney, Agent, or Firm* — Howison & Arnott, LLP

(57) ABSTRACT

An interface circuit is provided that is adapted to connect a microphone circuit to a preamplifier. The microphone circuit has a microphone and at least an output node and the preamplifier has at least an input node connected to the output node by the interface circuit. The interface circuit has at least a decoupling capacitor for DC decoupling the input node from the output node. The decoupling is connected between the input node and the output node. The interface circuit has at least one active circuit, comprising a resistor connected the decoupling capacitor. The resistor acts as part of a resistance multiplier and has an equivalent resistance that together with the decoupling capacitor defines a high-pass filter connected between the microphone and the preamplifier. The interface circuit may also have a biasing circuit connected to the resistor.

13 Claims, 5 Drawing Sheets

(56) References Cited

U.S. PATENT DOCUMENTS 5,652,537 A 7/1997 Fleeman
2007/0217628 A1* 9/2007 Boor .............................. 381/111

OTHER PUBLICATIONS

Joseph Kreutz: "Mini Sixties Plus," Elektor vol. 7/8, Jan. 1, 2010, p. 85.

* cited by examiner

INTERFACE CIRCUIT FOR CONNECTING A MICROPHONE CIRCUIT TO A PREAMPLIFIER

CROSS-REFERENCE TO RELATED APPLICATIONS

This application is a U.S. National Phase application submitted under 35 U.S.C. §371 of Patent Cooperation Treaty application serial no. PCT/EP2011/068029, filed Oct. 14, 2011, and entitled INTERFACE CIRCUIT FOR CONNECTING A MICROPHONE CIRCUIT TO A PREAMPLIFIER, which application claims priority to European patent application serial no. EP 10191206.1, filed Nov. 15, 2010, and entitled INTERFACE CIRCUIT FOR CONNECTING A MICROPHONE CIRCUIT TO A PREAMPLIFIER, and to U.S. provisional application Ser. No. 61/429,930, filed Jan. 5, 2011, and entitled INTERFACE CIRCUIT FOR CONNECTING A MICROPHONE CIRCUIT TO A PREAMPLIFIER.

Patent Cooperation Treaty application serial no. PCT/EP2011/068029, published as WO 2012/065793, and European patent application serial no. EP 10191206.1, and U.S. provisional application Ser. No. 61/429,930, are incorporated herein by reference.

TECHNICAL FIELD

The present disclosure relates to an interface circuit for connecting a microphone circuit to a preamplifier.

BACKGROUND

One of the main aspects to take into account in the development of an electronic device, especially mobile devices, is the area occupation. In the field of mobile devices, such as mobile phones, the reduction of the area occupation on the Printed Circuit Board (PCB) is a key point in order to create phones with much more functionalities without altering their dimensions. The focus, during the years, has been to integrate inside a chip, where possible, all those passive components such as resistors, capacitors and inductors which represent the main limit for the area reduction. Inside old generation phones, such components were SMD (Surface Mount Devices) mounted directly on the main board. Later on, thanks to improvement in the technology, these devices were placed inside the chip package, a methodology known as PDI (Passive Device Integration), and in some cases directly integrated inside the chip. However, when it comes to the microphone preamplifying path the implementation of this approach has not been possible due to the huge capacitance value of the decoupling capacitors needed between the microphone and the preamplifier.

FIGS. 1 and 2 show two known ways, single-ended and differential, respectively, to bias and connect the microphone circuit $MC_S$, $MC_D$ to a preamplifier $PA_S$, $PA_D$ using an RC network. The microphone circuit $MC_S$, $MC_D$ comprises a microphone 3 and a biasing circuit $R_{MB1}$, $R_{MB2}$, $R_{MB3}$, C1, C2, feed by a bias voltage $V_{BIAS}$.

The DC bias voltage of the signal coming from the microphone circuit $MC_S$, $MC_D$ at the output nodes $M_O$, $M_O'$ of the microphone circuit $MC_S$, $MC_D$ will depend exclusively by the biasing circuit $R_{MB1}$, $R_{MB2}$, $R_{MB3}$, C1, C2 and is usually different from the DC bias input voltage of the preamplifier $PA_S$, $PA_D$. The level shifting between the microphone 3 and the preamplifier $PA_S$, $PA_D$ DC biasing voltages is commonly obtained using a decoupling capacitor $C_{DEC}$ that produces, with the preamplifier $PA_S$, $PA_D$ input resistance, a first order high-pass filter whose corner frequency is generally lower than 20 Hz in order to avoid in-band audio signal perturbation.

More detailed representations of the differential preamplifier $PA_D$ are shown in FIG. 3 (inverting configuration) and FIG. 4 (non-inverting configuration).

In the inverting case, due to noise generation, input resistors $R_{1A}$ and $R_{1B}$ cannot have high resistance values (typically from 10 kOhm to 50 kOhm), whereas in the non-inverting solution resistors $R_{3A}$ and $R_{3B}$ are used only to bias the amplifiers OA inputs at a voltage $V_{CM}$ midway between ground and the supply voltage. Accordingly, resistors $R_{3A}$ and $R_{3B}$ don't contribute in noise generation and can be made with larger resistance values with respect to the inverting case (however, not more than some hundred of kOhms due to area occupation). In both cases, decoupling capacitors $C_{DEC}$ of more than 100 nF are needed and such large capacitance values would be difficult to integrate in a chip. In fact, with actual technologies on chip integration of a capacitor having such large capacitance value would require an area greater than 20 mm² and this fact made the integrating approach practically unusable. US 2002/0125949 discloses the above problem of the waste of area due to the integration in the chip of the decoupling capacitor $C_{DEC}$, confirming that the integration of the decoupling capacitors $C_{DEC}$ is practicable only for relatively reduced capacitance values. Moreover, unfortunately, even with the PDI methodology the decoupling capacitors $C_{DEC}$ can't be realized because of their high capacitance value and the fact that none of their terminals are connected to a fixed potential. This is the reason why all the existing known solutions use SMD capacitors. Since a preamplifier usually has several inputs (voice microphone, mono and stereo audio microphone, mono and stereo line-in, etc.) and each one could be differential, it is clear that on a mobile phone's PCB there are many SMD decoupling capacitors $C_{DEC}$.

This is obviously a bottle neck for the area reduction strategy, and there is a strong felt need of trying to find a solution to this problem, till now without success. The same above described problem holds for other consumer devices different from mobile phones, such as portable MP3 players, digital photo cameras, digital audio recorders, video cameras, and in general in devices with audio communication and/or recording capabilities.

Resistance multipliers are already known in the state of art for example from the publication "Mini Sixties Plus", Joseph Kreutz, ELECTOR, vol. 7/8, page 85 and from U.S. Pat. No. 5,652,537. However in the state of art, it was never proposed or suggested to adopt these multipliers in interface circuits for connecting a microphone circuit to a preamplifier with the aim of making possible the integration of decoupling capacitors $C_{DEC}$. This is likely due to the fact that it is difficult to find a solution that adopts resistance multipliers such as the ones disclosed in the two above cited documents and which in the meantime is also adapted to provide a correct biasing, namely a fixed and stable biasing, of the preamplifier's input.

SUMMARY

In view of the above described limitations of the prior art interface circuits between a microphone circuit and a preamplifier, it is an object of an embodiment to provide an interface circuit for connecting a microphone circuit to a preamplifier which is adapted to solve the above indicated problem concerning the impossibility of reducing the area occupation below a desired value due to the presence of one or more decoupling capacitors that cannot be integrated on a chip.

The above object is reached by an interface circuit adapted to connect a microphone circuit to a preamplifier, the microphone circuit comprising a microphone and at least an output node and the preamplifier comprising at least an input node adapted to be connected to the output node through the interface circuit. The interface circuit comprises at least a decoupling capacitor for DC decoupling said input node from said output node, the decoupling capacitor having a first end connected/connectable to said input node and a second end connected/connectable to said output node. The interface circuit comprises at least one active circuit comprising a resistor with a first end connected to the first end of the decoupling capacitor. Moreover, the interface circuit comprises a biasing circuit connected to a second end of said resistor for biasing said input node of the preamplifier with a desired bias voltage. The active circuit is adapted to operatively act as a resistance multiplier and has an equivalent resistance that together with the decoupling capacitor defines a high-pass filter operatively connected/connectable between the microphone and the preamplifier. Since the equivalent resistance can be theoretically made as high as desired, the decoupling capacitor can have a relatively reduced capacitance value, with respect to the above described prior art circuits, allowing the on-chip integration of the decoupling capacitor. Moreover, thanks to the arrangement of the biasing circuit it is possible to provide a fixed and stable bias voltage to the preamplifier's input.

According to an embodiment, the active circuit comprises a unity gain amplifier circuit.

According to an embodiment, the active circuit comprises a first MOS source follower and a second MOS source follower, each of said MOS source followers having a respective gate terminal, a drain terminal and a source terminal, the gate terminal of the second MOS source follower being connected to the source terminal of the first MOS source follower. The first end of the resistor is connected to the gate terminal of the first MOS source follower and the second end of the resistor is connected to the drain terminal of the first MOS source follower and to the source terminal of the second MOS source follower.

According to a more particular embodiment:
the active circuit comprises a current generator having an output terminal connected to the second end of the resistor and having a control terminal; and
the biasing circuit comprises an operational amplifier having an output terminal connected to said control terminal.

BRIEF DESCRIPTION OF THE DRAWINGS

Further features and advantages of the present invention will become more apparent from the following detailed description of exemplary but non-limiting embodiments thereof, as illustrated in the attached figures, in which.

DETAILED DESCRIPTION

In the attached figures identical or similar elements will be indicated with the same reference numbers/symbols.

Figure 1:
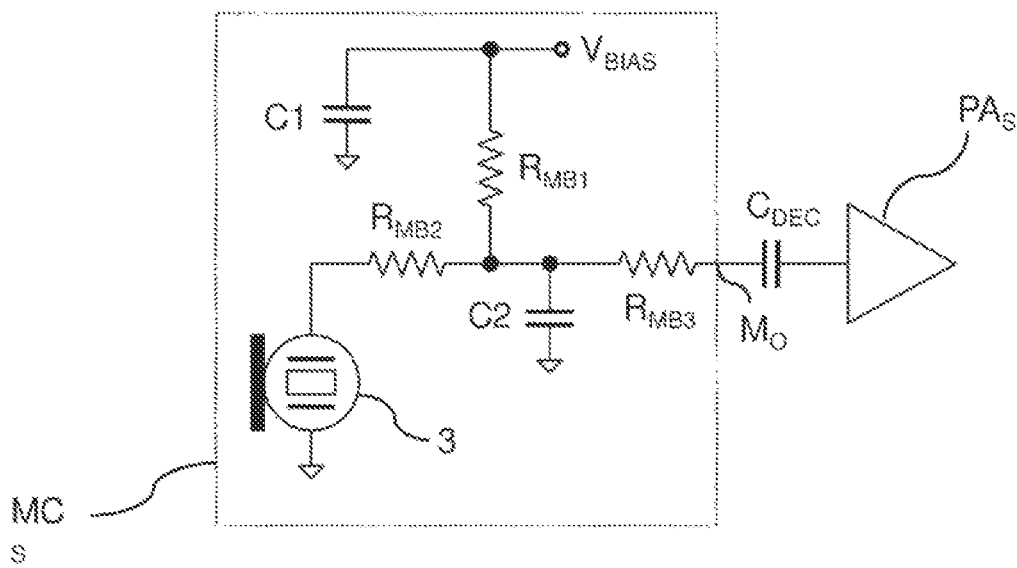
FIG. 1 shows a schematic view of a first example of prior art microphone system comprising a microphone circuit and a preamplifier.
Figure 2:
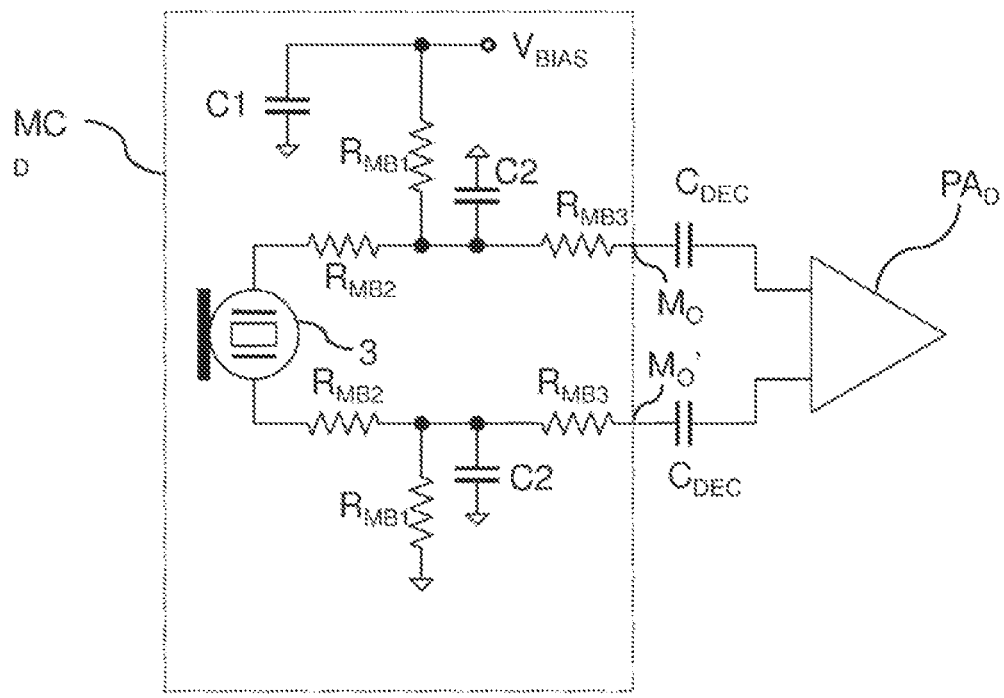
FIG. 2 shows a schematic view of a second example of prior art microphone system comprising a microphone circuit and a preamplifier.
Figure 3:
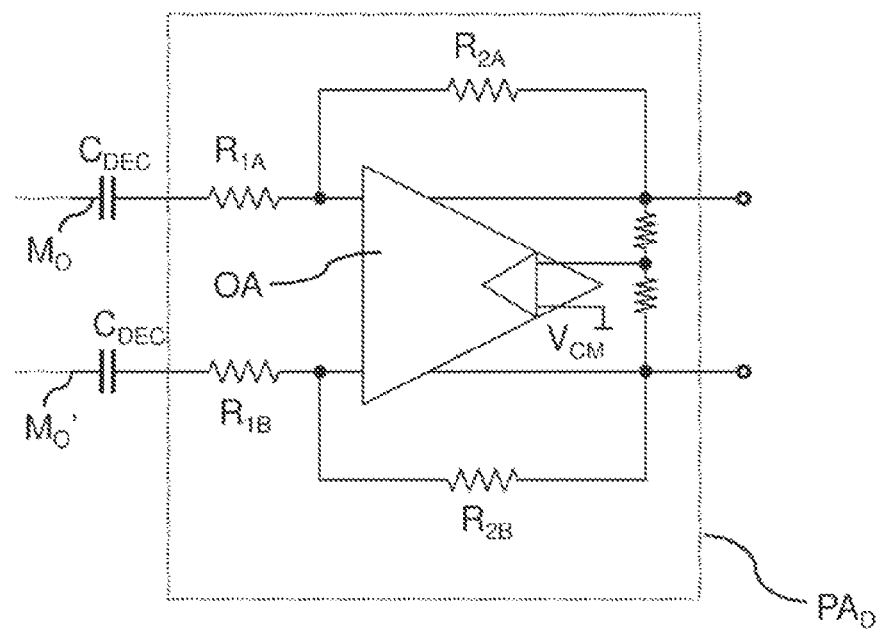
FIG. 3 shows a schematic view of a first example of a known preamplifier for the microphone system of FIG. 2.
Figure 4:
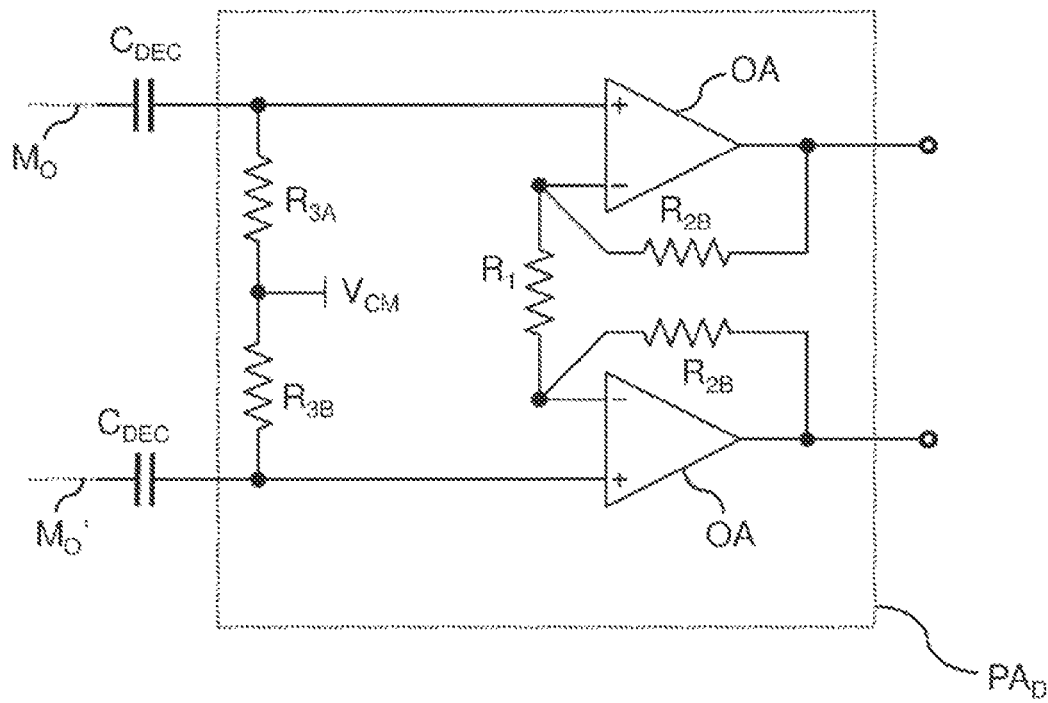
FIG. 4 shows a schematic view of a second example of known preamplifier for the microphone system of FIG. 2.
Figure 5:
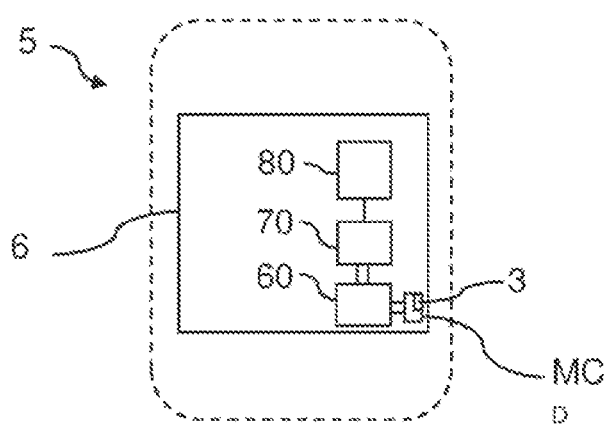
FIG. 5 shows a very schematic view of a device provided with audio recording and/or communication capabilities.

FIG. 5 shows a very schematic view of an embodiment of mobile terminal 5, such as for example a mobile phone 5, comprising a microphone circuit $MC_D$. According to an embodiment, and without for this reason introducing any limitation, the microphone circuit $MC_D$ may be similar to the differential microphone circuit $MC_D$ represented in FIG. 2. The microphone circuit $MC_D$ comprises a microphone 3, a microphone's biasing network and two differential output nodes $M_O$, $M_O'$. According to an embodiment, the microphone's biasing network may be identical or similar to the known biasing network of FIG. 2.

The mobile phone 5 comprises a circuit board 6 comprising an integrated microphone preamplifier circuit 60. According to the embodiment shown, the circuit board 6 further comprises an analog to digital converter 70 and a digital audio processor 80.

As the general structure and the operation of a mobile terminal, such as for example a mobile phone, are well known to a man skilled in the field, for sake of conciseness they will not be detailed further in the following part of the description. On the contrary, the following part of the description will be mainly focused on the microphone preamplifier circuit 60. It is important to remark that such microphone preamplifier circuit 60 can be also employed in systems and and/or devices different from a mobile terminal 5, for example in general in devices having audio communication or recording capabilities such as, digital audio recorders, MP3 players, photocameras etc.

Figure 6:
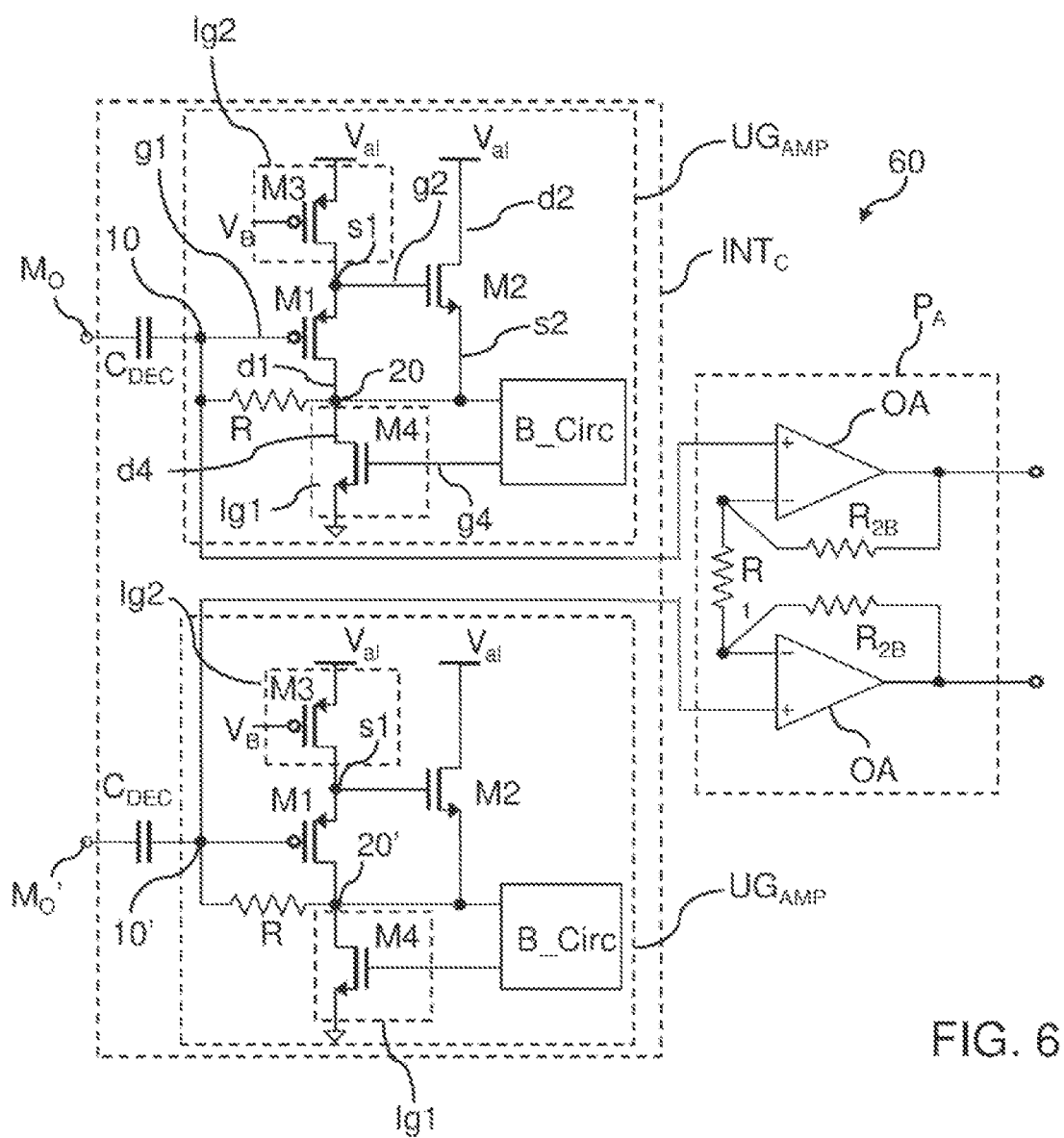
FIG. 6 shows a microphone preamplifier circuit comprising a preamplifier and an interface circuit provided with a biasing circuit for biasing the preamplifier.

FIG. 6 shows an embodiment of microphone preamplifier circuit 60 comprising a preamplifier $P_A$ and an interface circuit $INT_C$ adapted to connect the microphone 3, or more precisely the microphone circuit $MC_D$, to the preamplifier $P_A$.

According to the embodiment shown, the preamplifier $P_A$ is a differential preamplifier having two input nodes 10, 10', two operational amplifiers OA, three resistors R1, $R_{2B}$, $R_{2B}$. The interface circuit $INT_C$ comprises two decoupling capacitors $C_{DEC}$ and two active circuits $UG_{AMP}$, $UG_{AMP}'$ each associated with a corresponding input node 10, 10'.

Since the structure of the interface circuit 60 in the embodiment shown is totally symmetrical, in the present description only the upper branch $C_{DEC}$, $UG_{AMP}$ of the interface circuit $INT_C$ will be detailed, namely the branch comprised between the output node $M_O$ and the input node 10, which is similar to the lower branch $C_{DEC}$, $UG_{AMP}'$ comprised between the output node $M_O'$ and the input node 10'. Moreover, it should be clear that even if in the present description an interface circuit $INT_C$ for connecting a differential microphone circuit $M_{CD}$ to a differential preamplifier $P_A$ will be disclosed, the teachings of the present description can be easily extended by a man skilled in the field to the case in which the interface circuit is adapted to connect a single-ended microphone circuit to a single-ended preamplifier.

With reference to FIG. 6, the decoupling capacitor $C_{DEC}$ is provided for DC decoupling the preamplifier's input node 10 from the output node $M_O$, and has a first end connected/connectable to the input node 10 and a second end connected/connectable to the output node $M_O$.

The active circuit $UG_{AMP}$ of the interface circuit $INT_C$ is connected to the first end of the decoupling capacitor $C_{DEC}$ and is adapted to operatively act as a resistance multiplier, having an equivalent resistance that together with the capacitance of decoupling capacitor $C_{DEC}$ defines a high-pass filter operatively connected/connectable between the microphone circuit $M_{CD}$ and the preamplifier $P_A$. According to an embodiment, the active circuit $UG_{AMP}$ comprises a unity gain amplifier circuit. More particularly, according to the embodiment shown, the active circuit $UG_{AMP}$ comprises:
- a first MOS source follower M1 and a second MOS source follower M2, each of said MOS source followers having a respective gate terminal g1, g2, a drain terminal d1, d2 and a source terminal s1, s2, the gate terminal g2 of the second MOS source follower M2 being connected to the source terminal s1 of the first MOS source follower M1;
- a resistor R having a first end connected to the gate terminal g1 of the first MOS source follower M1 and a second end connected at a common node 20 to the drain terminal d1 of the first MOS source follower M1 and to the source terminal s2 of the second MOS source follower M2.

The input node 10 of the preamplifier $P_A$ represents a common node between the first end of the decoupling capacitor $C_{DEC}$, the gate terminal g1 of the first MOS source follower M1 and the first end of resistor R.

The active circuit $UG_{AMP}$ comprises a biasing circuit B_Circ for biasing the preamplifier $P_A$ and in particular the input node 10 of the preamplifier $P_A$ with a predetermined fixed and stable bias voltage, for example to the common mode voltage $V_{CM}$ of the preamplifier $P_A$. In the embodiment of FIG. 6 the biasing circuit B_Circ is connected to the common node 20, i.e. to the second end of resistor R.

According to the embodiment shown, the active circuit $UG_{AMP}$ further comprises a first current generator Ig1, having an output terminal d4 connected at node 20 and having a control terminal g4 connected to the bias circuit B_Circ and adapted to bias the MOS source followers M1 and M2. In the particular example shown, the current generator Ig1 is a MOS transistor M4 and the control and output terminals of said generator Ig1 are the gate g4 and the drain d4 terminals, respectively, of said MOS transistor M4.

Moreover, according to the embodiment shown, the active circuit $UG_{AMP}$ further comprises a second current generator Ig2, in the example comprising a MOS transistor M3, for biasing the MOS source follower M1, having a gate terminal feed with a fixed voltage $V_B$ and source terminal feed with a fixed voltage $V_{a1}$ and a drain terminal connected to the source terminal s1 of the MOS source follower M1.

Figure 7:
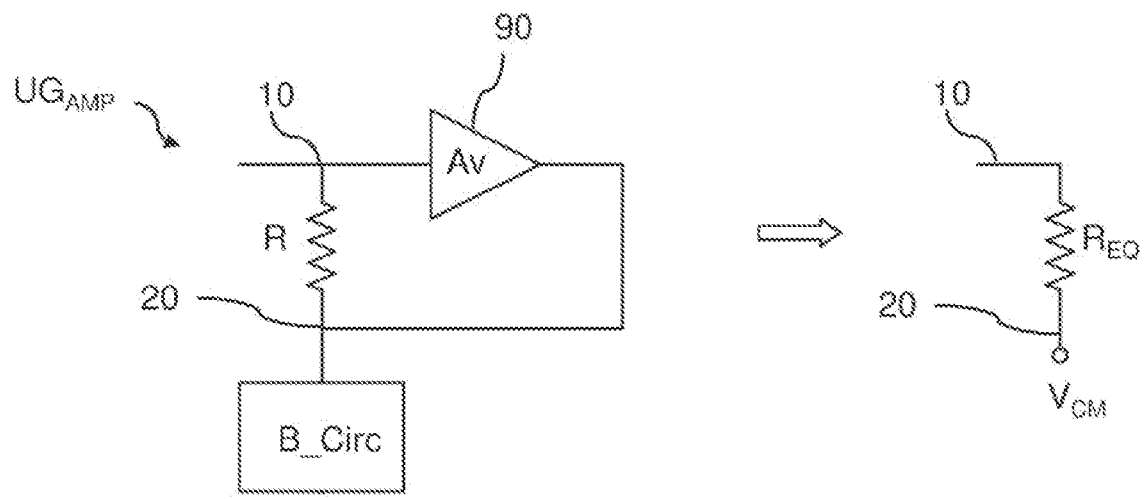
FIG. 7 shows a high level representation of the interface circuit of FIG. 6.

A high level schematic representation of the active circuit $UG_{AMP}$ of FIG. 6 is shown in FIG. 7. The active circuit $UG_{AMP}$ comprises a unity gain amplifier 90, more precisely an amplifier 90 having a gain $A_V$ very close to 1, that produces the resistance multiplication, and a biasing circuit B_Circ adapted to fix the DC voltage of nodes 10 and 20 to a desired bias voltage $V_{CM}$. Thanks to the resistance multiplication, the equivalent resistance $R_{EQ}$ is:

$$R_{EQ} = R \cdot \frac{1}{1 - A_V}.$$

In the embodiment of FIG. 6, wherein the unity gain amplifier 90 is realized using two MOS source followers M1 and M2 and wherein accordingly the signal present on each terminal of the resistor R is about the same, the equivalent resistance $R_{EQ}$ is:

$$R_{EQ} = R \cdot \frac{1}{1 - A_{V12}}$$

where $A_{V12}$ is the voltage gain between node 10 and node 20 and is equal to:

$$A_{V12} \cong \frac{gm2}{gm2 + 1/Z_2}$$

where:
  gm2 is the transconductance of the MOS source follower M2,
  $Z_2$ is the output resistance at node 20, equal to:

$$\frac{1}{Z_2} \cong gds2 + gds3 + gds4 + \frac{gm2}{gm1} \cdot gds3$$

where:
  gm1 is the transconductance of the MOS source follower M1;
  gds2 is the output conductance of MOS source follower M2;
  gds3 is the output conductance of MOS transistor M3;
  gds4 is the output conductance of MOS transistor M4.

It is clear from the present description that, since $R_{EQ}$ can have a very high value (for example few hundred MOhms if the resistance value of resistor R is about 100 kOhms), the decoupling capacitor $C_{DEC}$ can have a relatively reduced capacitance value (with respect to prior art interface circuits), for example from 10 pf to 100 pf and can be therefore easily integrated on a chip.

Figure 8:
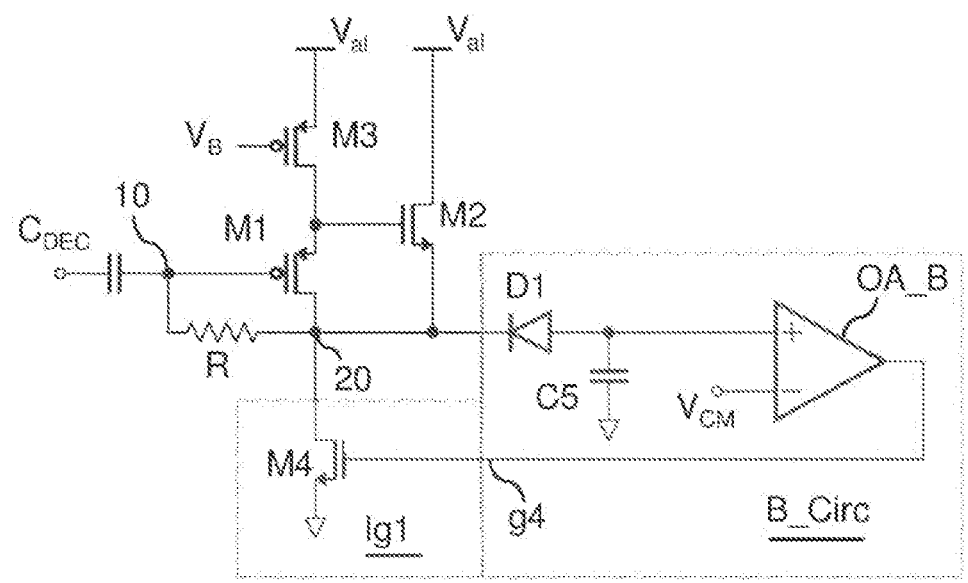
FIG. 8 shows a partial view of the microphone preamplifier circuit of FIG. 6, wherein a first embodiment of the biasing circuit is shown.
Figure 9:
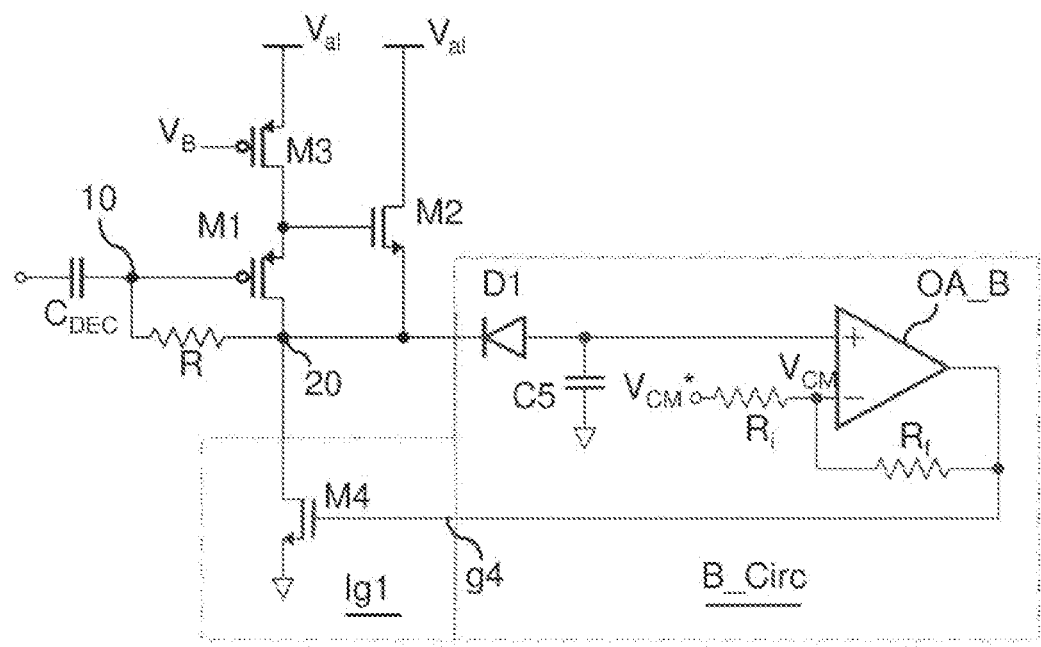
FIG. 9 shows a partial view of the microphone preamplifier circuit of FIG. 6, wherein a second embodiment of the biasing circuit is shown.
Figure 10:
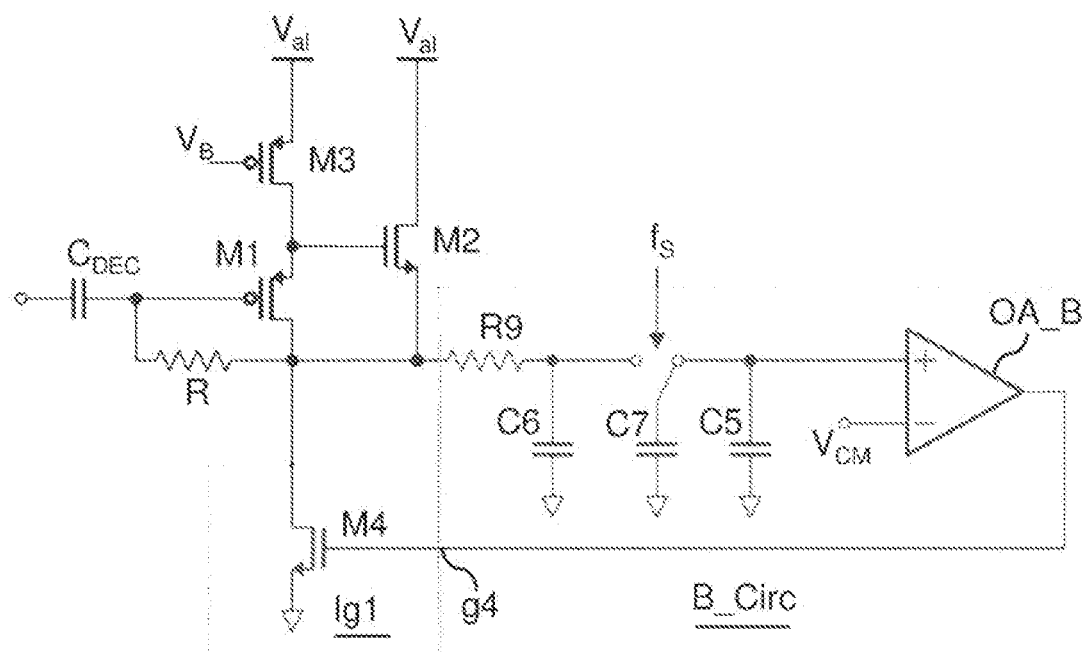
FIG. 10 shows a partial view of the microphone preamplifier circuit of FIG. 6, wherein a third embodiment of the biasing circuit is shown.

With reference to FIGS. 8-10, three embodiments of possible biasing circuits B_Circ that can be employed in the interface circuit $INT_C$ of FIG. 6 will be disclosed in the following part of the description. Such circuits B_Circ share among them the functions of forcing the biasing voltage of node 20 to a desired bias value, in this specific example equal to the common mode voltage $V_{CM}$ (for example half of the supply voltage) of the preamplifier $P_A$, and of becoming of high impedance for frequencies higher than a desired frequency (about 20 Hz for voice/audio applications) in order to let node 20 follow the signal at node 10, i.e. the input signal.

With reference to FIG. 8, according to a first embodiment, the biasing circuit B_Circ comprises an operational amplifier OA_B having an output terminal connected to the control terminal g4 of the first current generator Ig1. The biasing circuit B_Circ further comprises a low pass filter D1, C5 comprising a reverse polarized diode D1 and a capacitor C5 having a common node connected at first input of the operational amplifier OA_B. The diode D1 is further connected to the common node 20 of the active circuit $UG_{AMP}$. The operational amplifier OA_B is an open loop amplifier having a second input fed with the desired bias voltage $V_{CM}$. In the above biasing circuit B_Circ, the reverse polarized diode D1 is used to implement a high impedance (a P-N junction at 0 Volts) of the low pass filter D1, C5.

For frequencies lower than the desired cut-off frequency (for example of about 20 Hz), the feedback of the operational amplifier OA_B is active and such amplifier OA_B sets the node 20 at the desired bias voltage $V_{CM}$. In the above embodiment of biasing circuit B_Circ of FIG. 7, the operational amplifier OA_B is not provided with a direct feedback between its input and its output but it is in an open-loop configuration. This works good if its gain is relatively low (<10) whereas for higher gain values there is a peaking in the frequency response between the operational amplifier's input and node 20.

In a second embodiment of biasing circuit B_Circ, shown in FIG. 9, is it possible to close the operational amplifier OA_B with a resistive feedback $R_i$, $R_f$, thus improving the above explained embodiment of FIG. 8. The resistive feedback $R_i$, $R_f$ is adapted for fixing the gain of the operational amplifier OA_B to a proper value (for example, not greater than 10), namely a value selected to avoid peaking in the frequency response. In this case, due to the partition between the feedback resistors $R_i$, $R_f$ a suitable voltage value $V_{CM}^*$ shall be applied to the resistor $R_i$ in order to apply to the operational amplifier's input the desired bias voltage value $V_{CM}$.

In a third embodiment of biasing circuit B_Circ, it is possible to further improve the above first and second embodiments. In particular, in the third embodiment shown in FIG. 10, the diode D1 has been replaced by a switched capacitor C7 and an RC low pass filter R9, C6 having a relatively small time constant with respect to the time constant τ of the low pass filter defined by switched capacitor C7 and capacitor C5. The switched capacitor C7 is equivalent to a resistor R7=1/$f_s$C7, where $f_s$ is the clock frequency of the switched capacitor C7. Accordingly, it is possible to achieve a time constant equal to:

$$\tau = R7 \times C5 = C5/(f_s \times C7).$$

The above time constant τ can be made as high as needed just making C7 and $f_s$ as small as possible. Moreover, such time constant τ is advantageously insensitive to process spreads and temperature variations since it depends only on a ratio between capacitances and a precise clock frequency $f_s$.

In the embodiment of FIG. 10, the resistor R9 and the capacitor C6 are not strictly necessary for the correct operation of the biasing circuit B_Circ but their use is recommended in order to avoid possible disturbances coming from the sampling structure and propagating to the signal at node 20. Moreover, in the embodiment of FIG. 10, the operational amplifier OA_B can have an open-loop or a closed-loop configuration depending on the same considerations described previously with reference to FIGS. 8 and 9. In the embodiment of FIG. 10 a clock signal with frequency $f_s$ is required, but this is not a problem because a clock is usually present on chips adapted to process voice and audio signals.

As is clear from the above description, thanks to the resistance multiplication effect of the active circuit, the above described embodiments of interface circuit have the advantage of requiring one or more decoupling capacitors $C_{DEC}$ having a relatively reduced value such that said capacitors can be integrated in the preamplifier's $P_A$ chip. The advantage in terms of area occupation is even greater when the preamplifier $P_A$ is shared between a plurality of n sources, such as for example n microphones circuits. In this case it is possible to place, or better to integrate, a multiplexer (for example, realized with CMOS transfer gates) just before the decoupling capacitor $C_{DEC}$ in order to allow the selective connection among the different n sources and the preamplifier $P_A$. In this case, only two relatively small decoupling capacitors $C_{DEC}$ (if the circuit is differential) are required instead of 2n external SMD capacitors, obtaining a large reduction in the area/space occupation.

Naturally, in order to satisfy contingent and specific requirements, a person skilled in the art may apply to the above-described interface circuits many modifications and variations, all of which, however, are included within the scope of protection of the invention as defined by the following claims.

The invention claimed is:

1. An interface circuit adapted to connect a microphone circuit to a preamplifier, wherein the microphone circuit comprises a microphone and at least an output node and wherein the preamplifier comprises at least an input node adapted to be connected to the output node through the interface circuit, the interface circuit comprises:
   at least a decoupling capacitor for DC decoupling the input node from the output node, the decoupling capacitor having a first end connected, or configured to be connected, to the input node and a second end connected or configured to be connected to the output node;
   at least one active circuit comprising:
      a resistor with a first end connected to the first end of the decoupling capacitor;
      a first MOS source follower; and
      a second MOS source follower, wherein each of the MOS source followers have a respective gate terminal, a drain terminal and a source terminal, and wherein the gate terminal of the second MOS source follower is connected to the source terminal of the first MOS source follower; and wherein the first end of the resistor is connected to the gate terminal of the first MOS source follower and the second end of the resistor is connected to the drain terminal of the first MOS source follower and to the source terminal of the second MOS source follower; and
   a biasing circuit connected to a second end of the resistor for biasing the input node of the preamplifier with a desired bias voltage;
   the interface circuit being configured to operatively act as a resistance multiplier and to have an equivalent resistance depending on a resistance of the resistor that together with the decoupling capacitor defines a high-pass filter operatively connected or configured to be connected between the microphone and the preamplifier.

2. The interface circuit according to claim 1, wherein the active circuit comprises a unity gain amplifier circuit.

3. The interface circuit according to claim 1, wherein:
   the active circuit further comprises a current generator having an output terminal connected to the second end of the resistor and having a control terminal; and wherein
   the biasing circuit further comprises an operational amplifier having an output terminal connected to the control terminal.

4. The interface circuit according to claim 3, wherein the current generator further comprises a MOS transistor comprising a gate terminal and a drain terminal, wherein the control and output terminals of the current generator are the gate and drain terminals of the MOS transistor respectively.

5. The interface circuit according to claim 1, wherein the preamplifier is a preamplifier having a common mode voltage and wherein the biasing circuit is adapted to bias the input node with the common mode voltage.

6. The interface circuit according to claim 3, wherein the biasing circuit is a low pass filter comprising a reverse polarized diode and a capacitor having a common node connected at a first input of the operational amplifier.

7. The interface circuit according to claim 6, wherein the operational amplifier is an open loop operational amplifier having a second input fed with the desired bias voltage.

8. The interface circuit according to claim 7, wherein the biasing circuit comprises a resistive feedback network of the operational amplifier.

9. The interface circuit according to claim 3, wherein the biasing circuit comprises a first low pass filter comprising a switched capacitor and a second capacitor both having a common node operatively connected or adapted to be connected at a first input of the operational amplifier, the operational amplifier having a second input fed with the desired bias voltage.

10. The interface circuit according to claim 9, wherein the biasing circuit further comprises a second low pass filter of the RC type in series with the first low pass filter, the second low pass filter having a time constant relatively small with respect a time constant of the first low pass filter.

11. The interface circuit according to claim 1, further comprising a multiplexer configured for selectively connecting the second end of the decoupling capacitor to one of a plurality of microphone circuits, the multiplexer, the decoupling capacitor and the preamplifier being integrated in a same chip.

12. A microphone preamplifier circuit comprising a preamplifier, an interface circuit and a microphone circuit; the microphone circuit comprises a microphone and at least an output node and the preamplifier comprises at least an input node adapted to be connected to the output node through the interface circuit, the interface circuit comprises:
   at least a decoupling capacitor for DC decoupling the input node from the output node, the decoupling capacitor having a first end connected, or configured to be connected, to the input node and a second end connected or configured to be connected to the output node;
   at least one active circuit comprising:
      a resistor with a first end connected to the first end of the decoupling capacitor;
      a first MOS device and a second MOS device, each of the MOS devices having a respective gate terminal, a drain terminal and a source terminal, the gate terminal of the second MOS device being connected to the source terminal of the first MOS device, and wherein the first end of the resistor is connected to the gate terminal of the first MOS device and the second end of the resistor is connected to the drain terminal of the first MOS device and to the source terminal of the second MOS device; and
   a biasing circuit connected to a second end of the resistor for biasing the input node of the preamplifier with a desired bias voltage;
   the interface circuit being configured to operatively act as a resistance multiplier and to have an equivalent resistance depending on a resistance of the resistor that together with the decoupling capacitor defines a high-pass filter operatively connected or configured to be connected between the microphone and the preamplifier.

13. A device provided with audio recording capabilities, the device comprising a microphone system comprising at least one microphone circuit and a microphone preamplifier circuit; the microphone circuit comprises a microphone and at least an output node; the microphone preamplifier circuit comprises a preamplifier and an interface circuit; the preamplifier comprises at least an input node adapted to be connected to the output node through the interface circuit, the interface circuit comprising:
   at least a decoupling capacitor for DC decoupling the input node from the output node, the decoupling capacitor having a first end connected, or configured to be connected, to the input node and a second end connected or configured to be connected to the output node;
   at least one active circuit comprising:
      a resistor with a first end connected to the first end of the decoupling capacitor;
      a first MOS device and a second MOS device, each of the MOS devices having a respective gate terminal, a drain terminal and a source terminal, the gate terminal of the second MOS device being connected to the source terminal of the first MOS device, and wherein the first end of the resistor is connected to the gate terminal of the first MOS device and the second end of the resistor is connected to the drain terminal of the first MOS device and to the source terminal of the second MOS device; and
   a biasing circuit connected to a second end of the resistor for biasing the input node of the preamplifier with a desired bias voltage;
   the interface circuit being configured to operatively act as a resistance multiplier and to have an equivalent resistance depending on a resistance of the resistor that together with the decoupling capacitor defines a high-pass filter operatively connected or configured to be connected between the microphone and the preamplifier.

* * * * *